United States Patent [19]
Sato et al.

[11] Patent Number: 5,479,372
[45] Date of Patent: Dec. 26, 1995

[54] DRAM CONTROL CIRCUIT

[75] Inventors: Fumiki Sato; Kouichi Fujita, both of Itami, Japan

[73] Assignee: Mitsubishi Denki Kabushiki Kaisha, Tokyo, Japan

[21] Appl. No.: 345,747

[22] Filed: Nov. 22, 1994

[30] Foreign Application Priority Data

Nov. 26, 1993 [JP] Japan .................................... 5-296591

[51] Int. Cl.⁶ ............................. G11C 11/401; G11C 7/00
[52] U.S. Cl. .................... 365/222; 365/189.07; 365/230; 365/02; 365/238.5
[58] Field of Search .............................. 365/222, 189.07, 365/230.02, 238.5, 236

[56] References Cited

U.S. PATENT DOCUMENTS

| | | | |
|---|---|---|---|
| 5,021,951 | 6/1991 | Baba | 365/222 |
| 5,295,109 | 3/1994 | Nawaki | 365/222 |
| 5,313,428 | 5/1994 | Inoue | 365/222 |
| 5,347,491 | 9/1994 | Kagami | 365/222 |

*Primary Examiner*—Tan T. Nguyen
*Attorney, Agent, or Firm*—Lowe, Price, LeBlanc & Becker

[57] ABSTRACT

A DRAM control circuit, having a second counter 12 which counts the number of times of generation of a refresh request signal generated by a first timer circuit 100, a set value register 13 which holds the maximum number of reservations for refreshing a DRAM 52, and a second comparator 14 which compares the count value of the counter 12 and a value held by the set value register 13, which cancels high-speed page mode and refreshes the DRAM 52 in a predetermined procedure only at a time when the second comparator 14 detects coincidence between the count value of the second counter 12 and a value held by the set value register 13. This configuration enables it to limit refreshing during high-speed page mode, while achieving a DRAM control circuit capable of operating in high-speed page mode more efficiently.

2 Claims, 9 Drawing Sheets

DRAM CONTROL CIRCUIT

BACKGROUND OF THE INVENTION

1. Field of the Invention

The present invention relates to a DRAM control circuit, particularly to a DRAM control circuit which supports high speed page mode.

2. Description of the Related Art

Among semiconductor memory devices, a DRAM (Dynamic Random Access Memory) is commonly used in microcomputer system in recent years. Configuration commonly used in the DRAM is such that an address is inputted after being divided into a row address and a column address for time sharing operation in order to reduce the number of pins, wherein a #RAS signal is used as a strobe signal for the row address and a #CAS signal is used as a strobe signal for the column address.

Symbol "#" in the names of the #RAS signal and the #CAS signal indicates that the signal is low-active.

The DRAM requires that each memory cell thereof is refreshed within a specified time interval. Among a plurality of methods of refreshing which are known for the present DRAM, #CAS-before-#RAS method is a relatively simple method.

A DRAM control circuit of the prior art wherein the #CAS-before-#RAS method is employed will be described below.

FIG. 1 is a block diagram showing an example of configuration of the DRAM control circuit of the prior art as described above which is built in a microprocessor.

In FIG. 1, numeral 50 denotes a microprocessor building in a conventional DRAM control circuit, 52 denotes a DRAM connected to the microprocessor 50, 51 denotes a CPU provided in the microprocessor 50. To the CPU 51, a data bus 1, an address bus 4, a clock signal line 9, a trigger signal line 22 and a read/write signal line 23 are connected.

The data bus 1 is connected to an external data bus 24 via a reading tri-state buffer and a writing tri-state buffer indicated by numerals 2 and 3, respectively, for the data inputting/outputting between the CPU 51 and the DRAM 52. The external data bus 24 is connected to an external terminal 61 of the microprocessor 50, while the external terminal 61 is further connected to an external terminal 71 of the DRAM 52. The reading tri-state buffer 2 and the writing tri-state buffer 3 are controlled by a signal generating circuit 15 to be described later.

The address bus 4 is provided for the purpose of sending from the CPU 51 to the DRAM 52 the address of data in the DRAM 52 to be inputted/outputted to/from the DRAM 52 via the data bus 1. The address bus 4 is connected to an external address bus 19 via a multiplexer 5. The external address bus 19 is connected to an external terminal 62 of the microprocessor 50, and the external terminal 62 is further connected to an external terminal 72 of the DRAM 52.

The multiplexer 5 time-divides an address, which is outputted from the CPU 51 onto the address bus 4, into a row address and a column address and outputs them to the external address bus 19. The multiplexer 5 is controlled by the signal generating circuit 15 to be described later.

To the clock signal line 9, a counter 10 is connected via a frequency divider 90. The frequency divider 90 divides a clock φ outputted from the CPU 51, and outputs pulse signals.

The counter 10 is a down counter in this example, and decrements its count value every time it receives a pulse from the frequency divider 90. Initial value of the counter 10 is given from by a reload register 11. Specifically, the value held by the reload register 11 is given to the counter 10 as the initial value every time the counter 10 underflows.

The frequency divider 90, the counter 10 and the reload register 11 constitute a timer circuit 100 which serves as timing means for generating a refresh request signal REFREQ of the DRAM 52 at specified constant time intervals. The refresh request signal REFREQ is generated at the timing when the counter 10 underflows and is initialized by the value held in the reload register 11, and is given to the signal generating circuit 15 via the refresh request signal line 101.

The signal generating circuit 15 generates the #RAS signal and the #CAS signal and, as described previously, controls the tri-state buffers 2, 3 and the multiplexer 5. Numeral 17 in the signal generating circuit 15 denotes a timing circuit which determines the timing of generating the #RAS signal and the #CAS signal, and numeral 18 denotes a trigger holding circuit which holds a trigger signal representing an access request given from the CPU 51 via a trigger signal line 22.

The #RAS signal generated by the signal generating circuit 15 is outputted to the external terminal 63 via an output signal line 20, and the #CAS signal is outputted to the external terminal 64 via an output signal line 21. The external terminals 63 and 64 of the microprocessor 50 are connected to the external terminals 73 and 74 of the DRAM 52 respectively.

Numeral 23 denotes a read/write signal line over which read/write signal R/#W, in the state of "0" when reading data from the DRAM 52 or in the state of "1" when writing data into the DRAM 52, is outputted from the CPU 51. The read/write signal line 23 is connected to an external terminal 65 as well as to the signal generating circuit 15 while the external terminal 65 is connected to an external terminal 75 of the DRAM 52.

The circuit shown in FIG. 1 requires the CPU 51 to set an appropriate value in the reload register 11 before starting the operation. Specifically, the CPU 51 sets such a value in the reload register 11 via the signal line 110 that the counter 10 underflows and the refresh request signal REFREQ is generated at a time interval of ten and several microseconds to satisfy a refreshing condition of the DRAM 52.

Internal configuration of the DRAM 52 is known to those skilled in the art, and the description thereof will be omitted.

Operation of the DRAM control circuit of the prior art wherein the #CAS-before-#RAS method as shown in FIG. 1 is employed is carried out as described below. It is assumed that an appropriate value is set in the reload register 11 by the CPU 51, as described above.

When a trigger signal representing the access request is inputted to the signal generation circuit 15 from the CPU 51 via the trigger signal line 22, the signal generation circuit 15 determines whether to read data from the DRAM 52 or to write data onto the DRAM 52, according to the state of the read/write signal line 23, that is, "1" or "0".

At first, the operation when the read/write signal R/#W is "1", namely when data is read from the DRAM 52, will be described below.

Because a row address is outputted onto the external address bus 19 usually, the signal generating circuit 15 at first activates the #RAS signal which is outputted therefrom onto the signal line 20. By this fact, the DRAM 52 recognizes the row address outputted onto the external address bus 19. Then the signal generating circuit 15 controls the multiplexer 5 thereby to switch the signal on the external address bus 19 to a column address, and thereafter the signal generating circuit 15 activates the #CAS signal which is outputted onto the signal line 21. By this fact, the DRAM 52 recognizes the column address outputted onto the external address bus 19.

Because the DRAM 52 starts the operation of reading data as described above, data outputted from the DRAM 52 is sent from the external data bus 24 to the CPU 51 via the reading tri-state buffer 2 and the data bus 1, when the signal generating circuit 15 turns the reading tri-state buffer to conducting state.

Thereafter, when the signal generating circuit 15 activates the #CAS signal outputted therefrom onto the signal line 21 and then activates the #RAS signal outputted therefrom onto the signal line 20, the operation of reading data from the DRAM 52 is completed.

Now the operation when the read/write signal R/#W is "0", namely when data is written onto the DRAM 52, will be described below.

At first, the signal generating circuit 15 activates the #RAS signal outputted therefrom onto the signal line 20, thereby to make the DRAM 52 recognize the row address. Then the signal generating circuit 15 controls the multiplexer 5 thereby to switch the signal on the external address bus 19 to a column address. The signal generating circuit 15 then turns the writing tri-state buffer 3 to conducting state thereby to send the data having been outputted onto the data bus 1 by the CPU 51 to the DRAM 52 and, at the same time, activates the #CAS signal to make the DRAM 52 recognize the column address. By this fact, the DRAM 52 starts writing operation of the data, which is outputted onto the external data bus 24 from the CPU 51 via the data bus 1 and the writing tri-state buffer 3, into itself. Thereafter, the signal generating circuit 15 activates the #CAS signal outputted therefrom onto the signal line 21 and negates the #RAS signal outputted therefrom onto the signal line 20, thereby to complete the operation of writing data onto the DRAM 52.

Now operation at refreshing will be described below.

Refreshing of the DRAM 52 by the #CAS-before-#RAS method is carried out by activating the #CAS signal earlier than the #RAS signal. Therefore, when the refresh request signal REFREQ is outputted from the timer circuit 100 onto the refresh request signal line 101, the signal generating circuit 15 at first activates the #CAS signal, then activates the #RAS signal, followed by negating of the #CAS signal and, at last, negating of the #RAS signal. The DRAM 52 is refreshed during the interval from the time when both the #CAS signal and the #RAS signal are activated to the time when the #CAS signal is negated.

When a conflict arises between the refresh request signal REFREQ outputted from the timer circuit 100 and the trigger signal outputted from the CPU 51, the signal generating circuit 15 executes refreshing of the DRAM 52 giving priority thereto.

There has been such a problem with a DRAM that it has low access rates although they have large storage capacities. In order to solve this problem, several high-speed access methods have been developed. In the high-speed page mode among one of these methods, when the same address is accessed repetitively, the #RAS signal is kept at "0", and the second and the following accesses are made by means of the #CAS signal while sending only the column address to the DRAM 52.

FIG. 2 is a block diagram showing a configuration example of the conventional DRAM control circuit built in a microprocessor employing such a page mode as described above.

Portions of the configuration shown in FIG. 2 which are different from the configuration shown in FIG. 1 will be described below.

To the address bus 4, a page address register 6 is connected via an electrical switch 7. The page address register 6 holds the row address portion (higher part) of the address outputted onto the address bus 4 from the CPU 51 when the electrical switch 7 opens (conducts) at a predetermined timing.

The row address portion of the address held by the page address register 6 is given to a comparator 8. To the comparator 8, an address is also directly inputted from the address bus 4, and the comparator 8 compares both addresses to check whether they coincide or not. In other words, the comparator 8 compares the row address portion at the present address and the row address portion of the address given when the electrical switch 7 opens. Result of comparison by the comparator 8 is given to the signal generating circuit 15. The result of comparison by the comparator 8 is reset to the state of coincidence by a predetermined procedure described later, after being held temporarily.

The signal generating circuit 15 is provided with a flip-flop (F/F) represented by numeral 16 therein. The flip-flop 16 holds an information indicating whether paging or not. Specifically, the flip-flop 16 is set to "1" when the comparator 8 determines that both addresses coincide. In other words, when the higher portion (row address) of the address held by the page address register 6 and the higher part (row address) of the address which is outputted from the CPU 51 at this time coincide with each other, it is in the state of high-speed paging wherein access can be started by activating the #CAS signal (this state will be hereinafter called the state of paging).

In the DRAM control circuit of such a configuration as shown in FIG. 2, when the higher portion (row address) of the address outputted from the CPU 51 at a certain timing and the higher portion (row address) of the address which is outputted from the CPU 51 at every timing later coincide, the state of coincidence is detected by the comparator 8 and stored in the flip-flop 16 (the flip-flop 16 is set to "1"). Under this state wherein the flip-flop is set, because the same address of the DRAM 52 is accessed successively, the signal generating circuit 15 keeps the #RAS signal at "0" and sends only the column address to the DRAM 52 in the second and the following accesses, thereby making continuous accesses by outputting only the #CAS signal. Such a state of access to the DRAM 52 is the high-speed page mode.

In the case where the DRAM is accessed in the high-speed page mode as described above, and refresh request is generated, the high-speed page mode is once canceled resulting in a problem of reduced efficiency of access.

Also when a DRAM of different storage capacity is used, or different bit constitution is employed (for example, ×1 bit or ×4 bits) resulting in different bit width of the address, a microprocessor comprising a DRAM cannot be designed with the DRAM control circuit of the same configuration. Thus it is required to design a DRAM control circuit exclusively for different configuration of the DRAM, resulting in increased manufacturing cost.

SUMMARY OF THE INVENTION

The present invention aims to solve the problems described above, and an object of the invention is to provide a DRAM control circuit capable of carrying out high-speed page mode operating more efficiently by limiting refreshing under high-speed page mode.

Another object of the invention is to provide a DRAM control circuit capable of adapting flexibly to DRAM of different storage capacity or different bit construction.

The invention relates to a DRAM control circuit wherein a row address signal among address signal outputted from a CPU is held in a first register, and the row address among an address signal at the present outputted from the CPU is compared with the row address held in the first register by first comparing means and, when both addresses coincide with each other, the so-called high-speed page mode is carried out. The DRAM control circuit comprises a counter which counts the number of times refresh request signal as generated by timing means, a second register which holds the maximum number of reservations for refreshing the DRAM and second comparing means which compares the count value of the counter and the value held by the second register, while under the high-speed page mode, the high-speed page mode is canceled and the DRAM is refreshed by a predetermined procedure only when the second comparing means determines that the count value of the counter and the value held by the second register coincide with each other.

In the DRAM control circuit of the invention, a multiplexer has means for dividing an address signal outputted from the CPU into a row address and a column address at different position according to a signal given in correspondence to the configuration of the DRAM, while the first comparator has means for comparing only the row address among the address signal outputted from the CPU according to the signal given in correspondence to the configuration of the DRAM.

In the DRAM control circuit of the invention, when the number of times of generation of refresh request signal reaches to the maximum number of reservation for refreshing held in the second register under high-speed page mode, it is detected by the second comparing means, thereby to cancel the high-speed page mode and to refresh the DRAM according to a predetermined procedure.

Also in the DRAM control circuit of the invention, even when DRAM of different configuration is connected, a multiplexer divides an address signal outputted from the CPU into a row address and a column address at different position according to a signal given in correspondence to the configuration of the DRAM, and only the row address among the address signal outputted from the CPU is compared by the first comparing means.

The above and further objects and features of the invention will more fully be apparent from the following detailed description with accompanying drawings.

DESCRIPTION OF THE PREFERRED EMBODIMENTS

The invention will now be described in detail below with reference to the drawings showing the preferred embodiments.

First Embodiment

Figure 1:
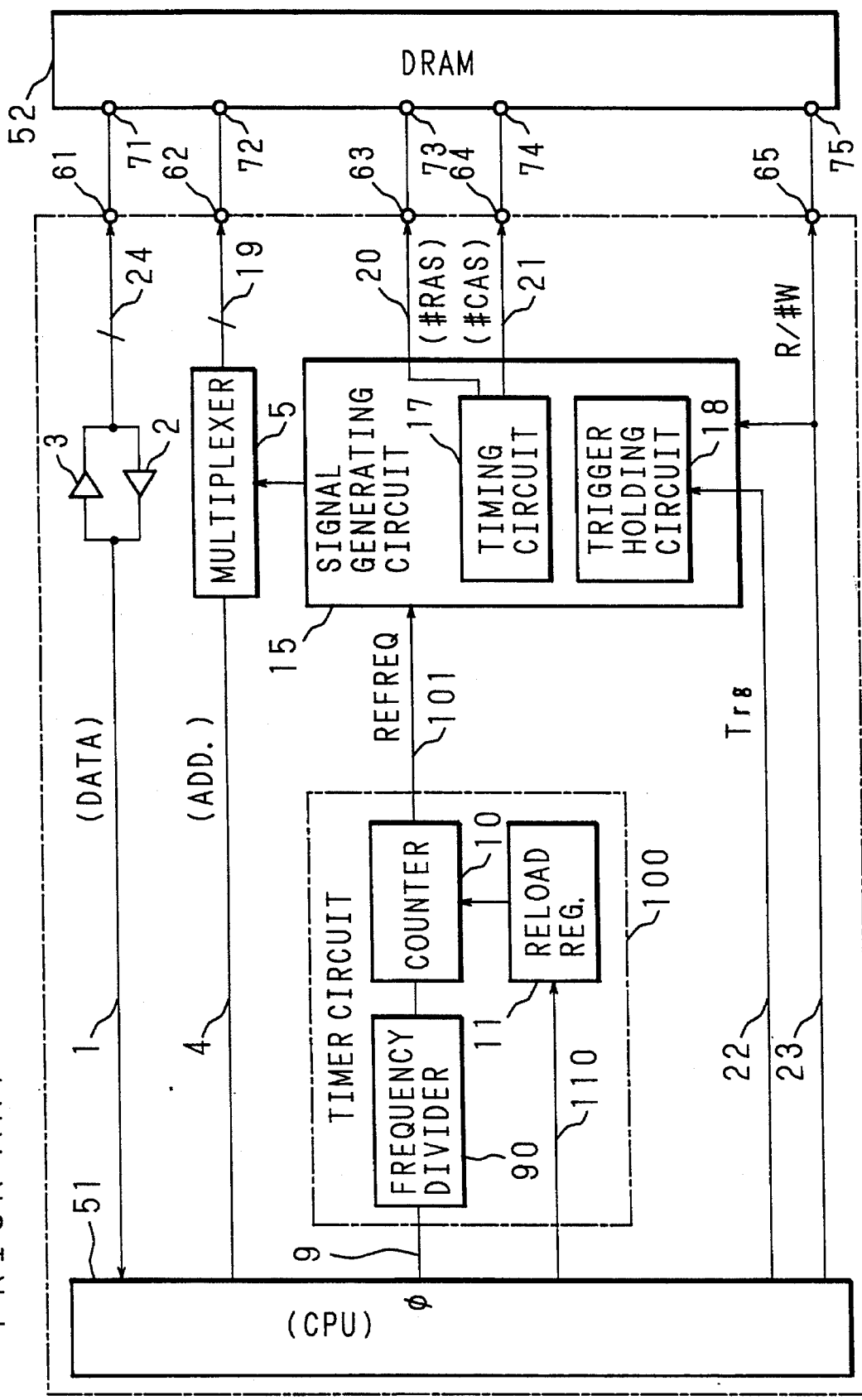
FIG. 1 is a block diagram showing an example of configuration of the conventional DRAM control circuit which is built in a microprocessor.
Figure 2:
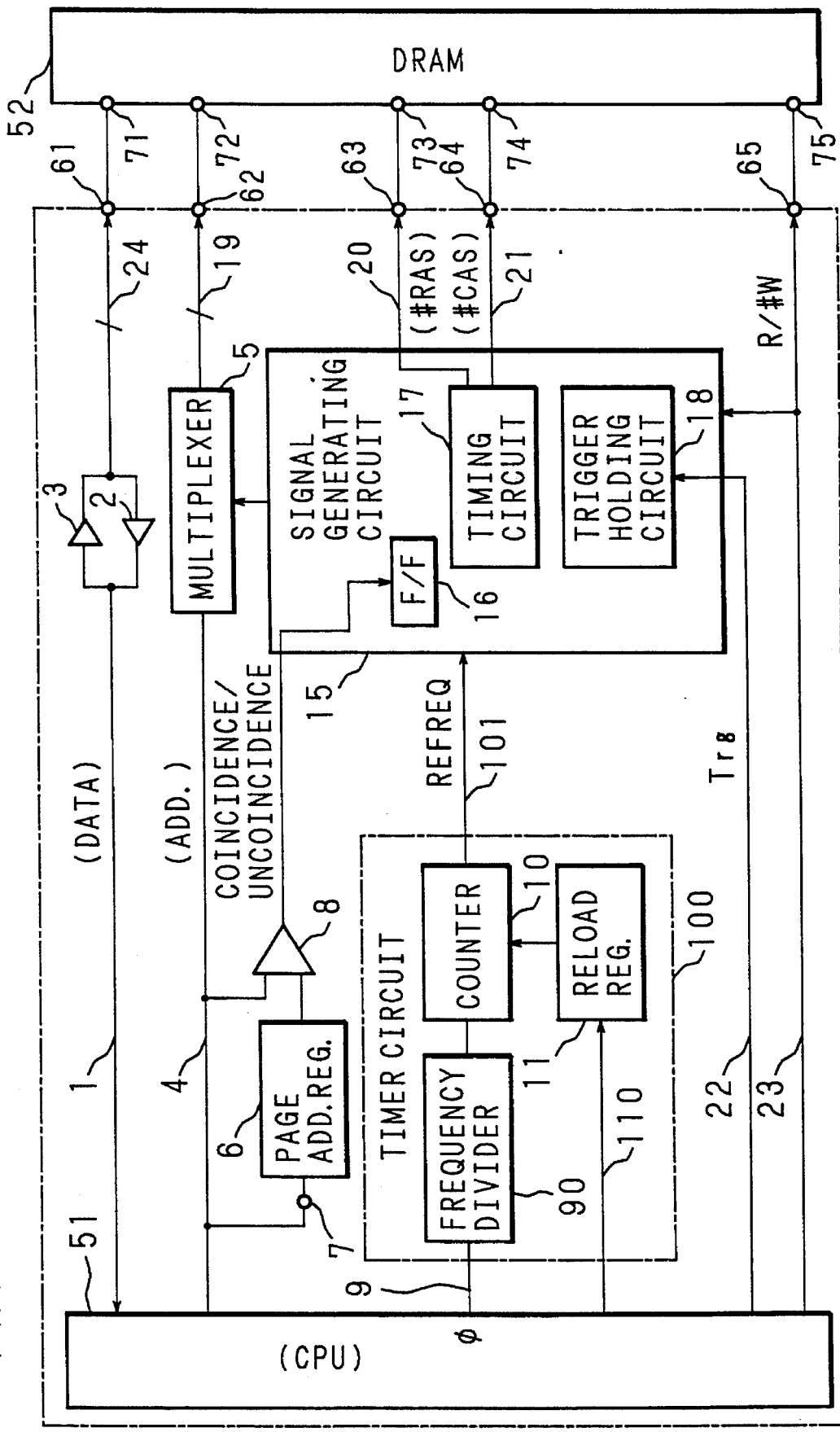
FIG. 2 is a block diagram showing an example of the configuration of the conventional DRAM control circuit which employs page mode and is built in a microprocessor.
Figure 3:
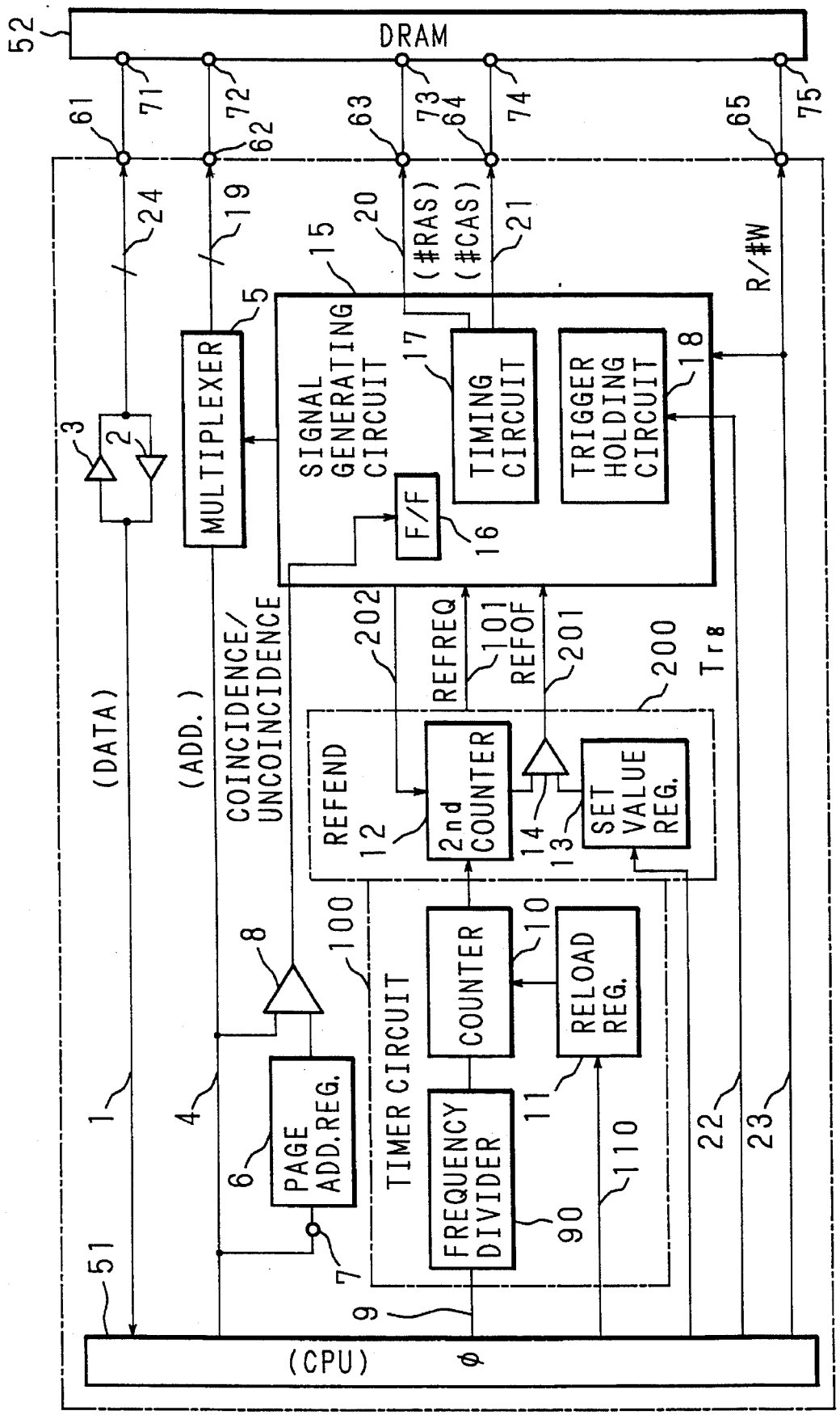
FIG. 3 is a block diagram showing a first, embodiment of the configuration of the DRAM control circuit of the invention which is built in a microprocessor.

FIG. 3 is a block diagram showing the first embodiment of configuration of a DRAM control circuit of the invention which is built in a microprocessor.

In FIG. 3, numeral 50 denotes a microprocessor building in the DRAM control circuit of the invention therein, 52 denotes a DRAM connected to the microprocessor 50, namely the DRAM to be controlled by the DRAM control circuit of the invention, and 51 denotes a CPU provided in the microprocessor 50. To the CPU 51, a data bus 1, an address bus 4, a clock signal line 9, a trigger signal line 22, a read/write signal line 23, and the like are connected.

The data bus 1 is connected to an external data bus 24 via a reading tri-state buffer and a writing tri-state buffer indicated by numerals 2 and 3, respectively, for inputting/outputting data between the CPU 51 and the DRAM 52. The external data bus 24 is connected to an external terminal 61 of the microprocessor 50, while the external terminal 61 is further connected to an external terminal 71 of the DRAM 52. The reading tri-state buffer 2 and the writing tri-state buffer 3 are controlled by a signal generating circuit 15 to be described later.

The address bus 4 is provided for the purpose of sending from the CPU 51 to the DRAM 52 the address of data in the DRAM 52 to be inputted/outputted to/from the DRAM 52 via the data bus 1. The address bus 4 is connected to an external address bus 19 via a multiplexer 5. The external address bus 19 is connected to an external terminal 62 of the microprocessor 50, and the external terminal 62 is further connected to an external terminal 72 of the DRAM 52.

To the address bus 4, a page address register 6 is also connected via an electrical switch 7. The page address register 6 holds the row address portion (higher part) of the address outputted onto the address bus 4 from the CPU 51 when the electrical switch 7 opens (conducts) at a timing to be described later. The row address portion of the address held by the page address register 6 is given to a first comparator 8. To the first comparator 8, an address is also inputted directly from the address bus 4, and the first comparator 8 compares both addresses to check whether they coincide or not. In other words, the first comparator 8 compares the row address portion of at the present address and the row address portion of the address given when the electrical switch 7 opens. Result of comparison by the first comparator 8 is given to the signal generating circuit 15. The result of comparison by the first comparator 8 is reset to the state of coincidence by a predetermined procedure described later, after being held temporarily.

The multiplexer 5 time-divides the address, which is outputted from the CPU 51 onto the address bus 4, into a row address and a column address and outputs them the external address bus 19. The multiplexer 5 is controlled by the signal generating circuit 15 to be described later.

To the clock signal line 9, a first counter 10 is connected via a frequency divider 90. The frequency divider 90 divides a clock φ outputted from the CPU 51 to output pulse signals.

The first counter 10 is a down counter in this embodiment, and decrements count value of itself every time it receives a pulse from the frequency divider 90. Initial value of the first counter 10 is given from a reload register 11. Specifically, the value held by the reload register 11 is given to the first counter 10 as the initial value whenever the first counter 10 underflows.

The frequency divider 90, the first counter 10 and the reload register 11 constitute a first timer circuit 100 which serves as timing means for generating a refresh request primary signal for the DRAM 52 at specified time intervals. The refresh request primary signal is generated at the timing when the first counter 10 is initialized by the value held in the reload register 11 after underflow, and is sent to a second counter 12.

The second counter 12 counts the refresh request primary signals outputted from the first counter 10. Specifically, the second counter 12 changes the value of itself depending on the refresh request primary signal and a refresh ending signal REFEND which is outputted from the signal generation circuit 15 in synchronization with the clock φ. When both the refresh request primary signal and the refresh ending signal REFEND are either "1" or "0", the second counter 12 keeps the count value of itself intact.

When the refresh ending signal REFEND is "1" and the refresh request primary signal is "0", the second counter 12 decrements the count value of itself by "1" and, when the refresh ending signal REFEND is "0" and the refresh request primary signal is "1", the second counter 12 increments the count value of itself by "1". When count value of the second counter 12 is 1 or greater, the second counter 12 generates the refresh request signal REFREQ and sends it to the signal generating circuit 15 via a refresh request signal line 101.

Numeral 13 denotes a set value register which holds the maximum number of reservation for refreshing the DRAM 52, namely the maximum number of refresh requests to the DRAM 52 that can be reserved. Numeral 14 denotes a second comparator which compares the value of the second counter 12 and the value of the set value register 13. When the result of comparison indicates that the value of the second counter 12 is equal to or greater than the value of the set value register 13, the second comparator 14 generates a refresh overflow signal REFOF and sends it to the signal generating circuit 15 via a signal line 201. In other words, the refresh overflow signal REFOF is a signal which becomes "1" when the #RAS signal is "0" and the period of such a state as access by activating the #CAS signal can be started under the high-speed page mode (this state will be called the state of paging hereinafter) has reached a specified length of time.

The second counter 12, the set value register 13 and the second comparator 14 constitute a second timer circuit 200 which provides such a time interval that allows to keep the state of paging.

The signal generating circuit 15 generates the #RAS signal and the #CAS signal and, as described previously, controls the tri-state buffers 2 and 3 and the multiplexer 5. Numeral 16 denotes a flip-flop which holds an information indicating whether the operation is in the state of paging or not. Numeral 17 denotes a timing circuit which determines the timing of generating the #RAS signal and the #CAS signal, and numeral 18 denotes a trigger holding circuit which holds a trigger signal representing an access request given from the CPU 51 via the trigger signal line 22.

The #RAS signal generated by the signal generating circuit 15 is outputted to the external terminal 63 via an output signal line 20, and the #CAS signal is outputted to the external terminal 64 via an output signal line 21. The external terminals 63 and 64 of the microprocessor 50 are connected to the external terminals 73 and 74 of the DRAM 52, respectively.

Numeral 23 denotes a read/write signal line over which a read/write signal R/#W in the state of "0" when writing data into the DRAM 52 or in the state of "1" when reading data from the DRAM 52 is sent from the CPU 51. The read/write signal line 23 is connected, as well as to the signal generating circuit 15, to an external terminal 65, while the external terminal 65 is connected to an external terminal 75 of the DRAM 52.

The DRAM control circuit of the invention shown in FIG. 3 requires the CPU 51 to set appropriate values in the reload register 11 and in the set value register 13 before starting the operation. Specifically, the CPU 51 sets such a value into the reload register 11 via the signal line 110 that the first counter 10 underflows to generate the refresh request primary signal at a time interval of ten and several microseconds which satisfies a refreshing condition of the DRAM 52. The CPU 51 also sets such a value into the reload register 11 via the signal line 210 that the product of the time interval of ten and several microseconds which satisfies the refreshing condition of the DRAM 52 and the set value does not exceed a RAS"L" pulse width indicated as the specification of the DRAM 52.

Internal configuration of the DRAM 52 is known to those skilled in the art, and therefore description thereof will be omitted.

Operation of the DRAM control circuit of the invention will be described below. Overall operation of the DRAM control circuit of the first embodiment will be described at first with reference to a flow chart, then specific examples of the operation will be described.

Before the operation is started, the CPU 51 sets appropriate values in the reload register 11 and the register 13, as described before.

Figure 4:
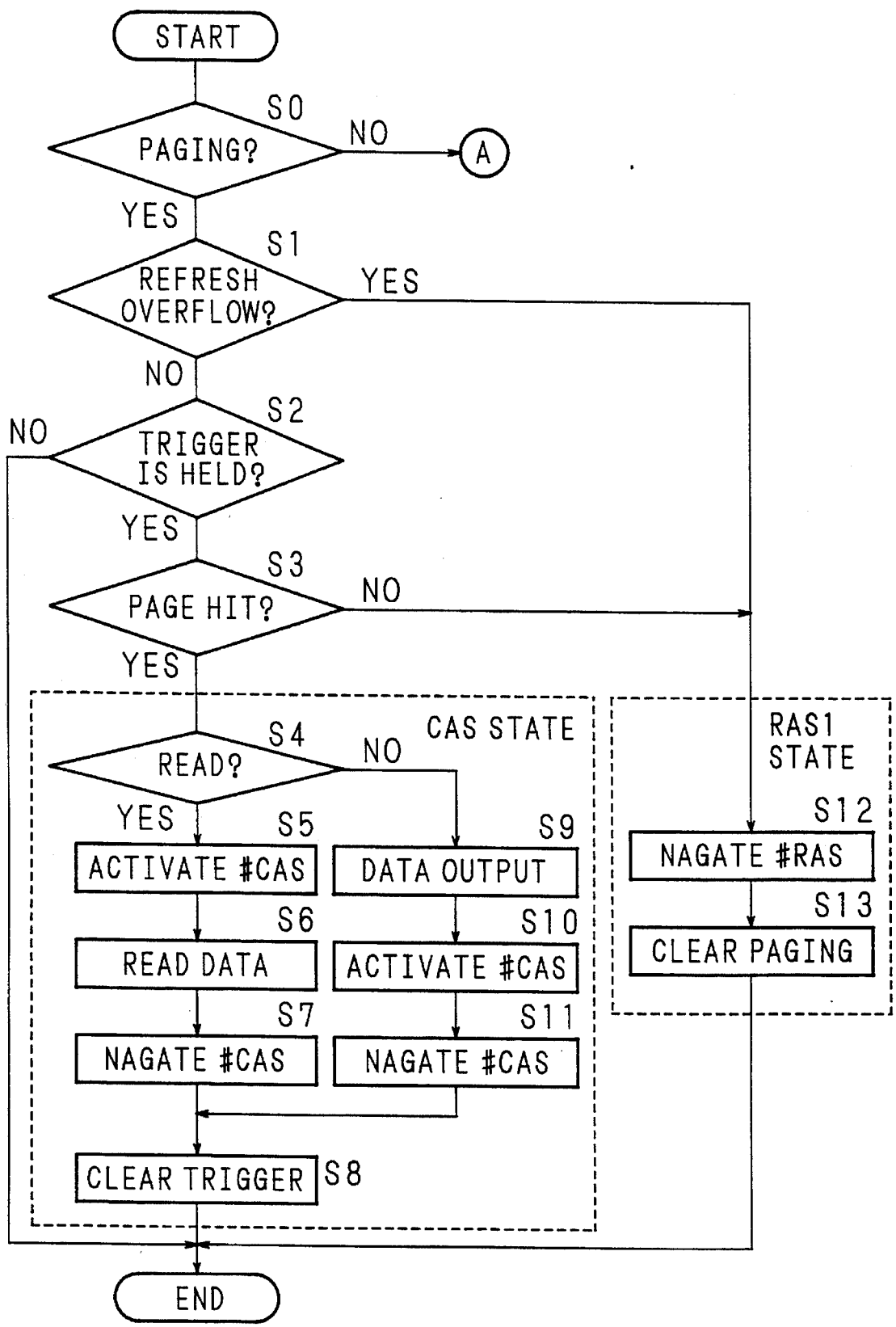
FIG. 4 is a flow chart showing an operation of a signal generating circuit of the first embodiment of the DRAM control circuit of the invention.
Figure 5:
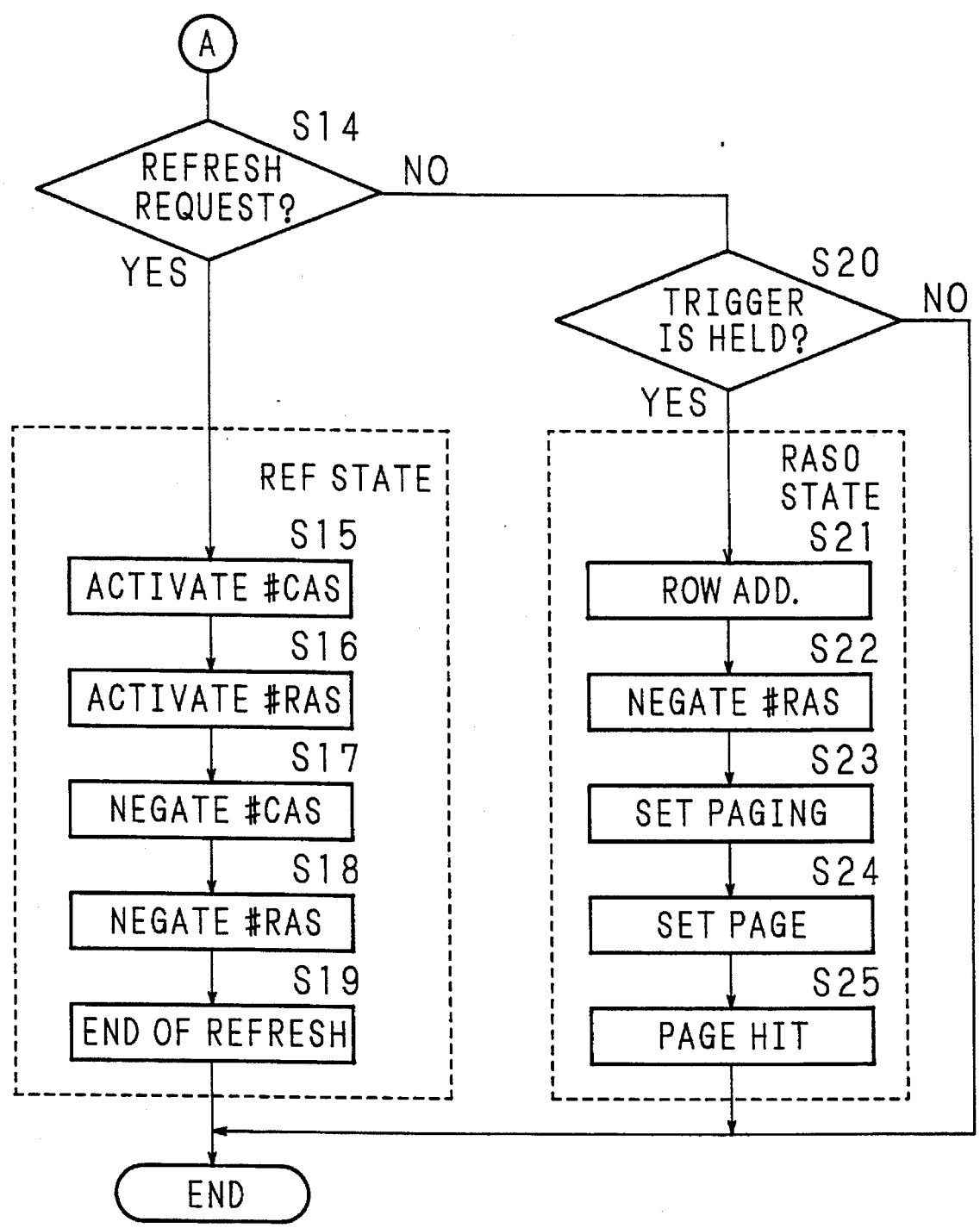
FIG. 5 is a flow chart showing an operation of a signal generation circuit of the first embodiment of the DRAM control circuit of the invention.

FIG. 4 and FIG. 5 are flow charts showing the operation of the signal generating circuit 15 of the first embodiment of the DRAM control circuit of the invention.

The signal generating circuit 15 at first judges from the value of the flip-flop 16 whether the operation is in the state of paging or not (step S0). When it is in the state of paging (YES in step S0), the signal generating circuit 15 checks the refresh overflow signal REFOF outputted from the comparator 14 onto the signal line 201 (step S1).

When the refresh overflow signal REFOF is non-active (NO in step S1), the signal generating circuit 15 checks to see whether the trigger holding circuit 18 holds the trigger which has been outputted from the CPU 51 or not (step S2). When the trigger holding circuit 18 holds the trigger (YES in step S2), the signal generating circuit 15 further checks to see whether the output of the first comparator 8 indicates coincidence or not (page-hit or not) (step S3).

When the output from the first comparator 8 indicates coincidence (YES in step S3), the subsequent accessings can be done by only the column address (no need of row address) by activating the #CAS signal, and therefore the signal generating circuit 15 judges at this time point which of read and write operations is to be done (step S4).

In case of reading (reading data from the DRAM 52) (YES in step S4), the signal generating circuit 15 activates the #CAS signal (step S5) to make the reading tri-state buffer 2 be conductive state and sends the data, which is outputted from the DRAM 52, from the external data bus 24 via the data bus 1 to the CPU 51 (step S6), then negates the #CAS signal (step S7) and then clears the trigger held by the trigger holding circuit 18 (step S8).

On the other hand, in case of writing (writing data into the DRAM 52) (No in step S4), the signal generating circuit. 15 turns the writing tri-state buffer 3 to conductive state and sends the data, which is outputted by the CPU 51 onto the data bus 1, via the external data bus 24 to the DRAM 52 (step S9) while activating the #CAS signal (step S10), then negates the #CAS signal (step S11), and then clears the trigger held by the trigger holding circuit 18 (step S8).

The state of the successive operations from the judgment of read/write (step S4) to clearing of the trigger held by the trigger holding circuit 18 (step S8) being carried out will be called a CAS state in the description that follows.

When the refresh overflow signal REFOF which is outputted from the second comparator 14 to the signal line 201 in step S1 is active (YES in step S1), or when the first comparator 8 does not indicate coincidence (NO in step S3), the signal generating circuit 15 negates the #RAS signal and resets the flip-flop 16, that is, resets the state of paging (step S12 and step S13).

The state of negating the #RAS signal (step S12) and resetting the flip-flop 16 will be called a RAS1 state hereinafter.

On the other hand, when it is judged that the operation is not in the state of paging at this time according to the set/reset state of the flip-flop 16 (NO in step S0), the signal generating circuit 15 then judges whether the second counter 12 is sending the refresh request signal REFREQ to the signal generating circuit 18 or not (step S14).

When refresh request is made at this time (YES in step S14), the signal generating circuit 15 refreshes the DRAM 52 by the #CAS-before-#RAS method. The #CAS-before-#RAS method is carried out by activating the #CAS signal earlier than the #RAS signal. Therefore, the signal generating circuit 15 at first activates the #CAS signal (step S15), and then activates the #RAS signal (step S16). Then the signal generating circuit 15 negates the #CAS signal (step S17), thereafter negates the #RAS signal (step S18), and at last sends the refresh ending signal REFEND to the second counter 12 (step S19). The state of making the successive processings by the signal generating circuit 15 from activating of the #CAS signal (step S15) to sending of the refresh ending signal REFEND to the second counter 12 (step S19) will be called a REF state in the description that follows.

When the second counter 12 is not outputting the refresh request signal REFREQ to the signal generating circuit 15 (NO in step S14), the signal generating circuit 15 judges to see whether the trigger holding circuit 18 is holding the trigger outputted from the CPU 51 or not (step S20).

In this case when the trigger holding circuit 18 holds the trigger which is outputted from the CPU 51 (YES in step S20), the signal generating circuit 15 controls the multiplexer 5 to output the row address from the external address bus 19 to the DRAM 52 (step S21). Then the signal generating circuit 15 activates the #RAS signal (step S22), sets the flip-flop 16, that is, sets the state of paging (step S23), turns the electrical switch 7 to conductive state and writes the row address portion (higher portion) of the address on the address bus 4 into the page address register 6, thereby to carry out page setting (step S24). At last, the signal generating circuit 15 corrects the result of comparison by the comparator 8, coincidence/uncoincidence, to the state of uncoincidence (step S25).

The state of making the successive processings by the signal generating circuit 15 from the output of the row address (step S21) to the correction of the result of comparison by the comparator 8, coincidence/uncoincidence, to the state of coincidence (step S25) will be called a RAS0 state in the description that follows.

When it is judged that the trigger holding circuit 18 is not holding the trigger outputted from the CPU 51 in steps S2 and S20, the signal generating circuit 15 does not carry out any processing.

Figure 6:
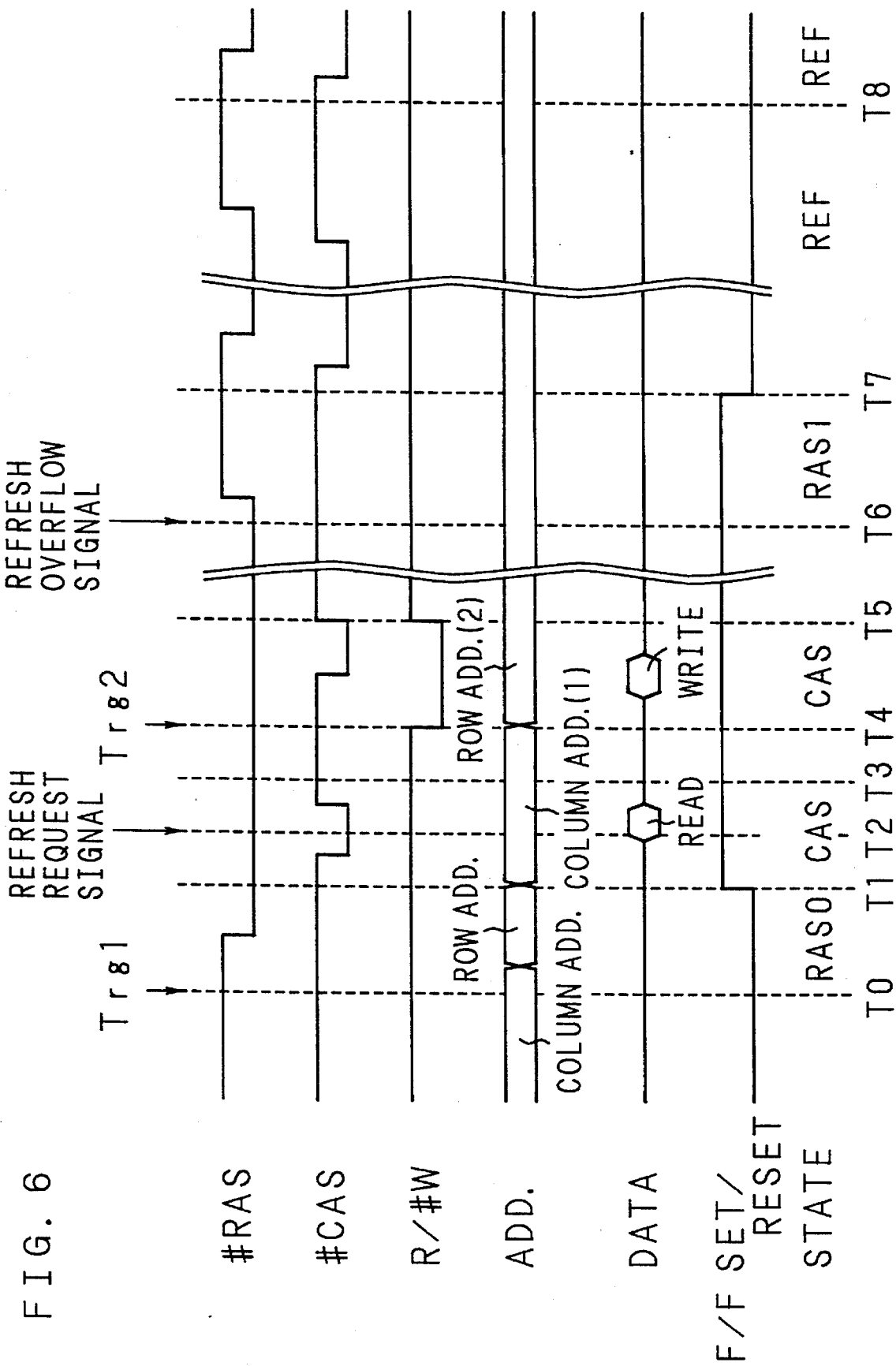
FIG. 6 is a timing chart showing changing of signals with time in the first embodiment of the DRAM control circuit of the invention.

Now the operation of the DRAM control circuit of the first embodiment will be described taking a specific example with reference to a timing chart. FIG. 6 is a timing chart showing the changes with time of, from top to bottom, the #RAS signal (#RAS), the #CAS signal (#CAS), the read/write (R/#W) signal, the external address bus (address) 18, the external data bus (data) 24 and set/reset of the flip-flop (F/F) 16.

At time T0, the CPU 51 outputs the trigger signal Trg1 to the signal generating circuit 15 for accessing the DRAM 52. The trigger Trg1 outputted from the CPU 51 is held by the trigger holding circuit 18 until the access to the DRAM 52 is completed. At this time, the flip-flop 16 is being reset and the value thereof is "0" (NO in step S0), that is, indicating that the DRAM 52 is not in the state of paging. Also because the value of the second counter 12 is "0" at this time, the second counter 12 does not output the refresh request signal REFREQ to the signal generating circuit 15 (NO in step S14).

The trigger signal Trg1 is held by the trigger holding circuit 18 (YES in step S20). Therefore the signal generating circuit 15 carries out the operation of the RAS0 state described above. That is, the signal generating circuit 15 controls the multiplexer 5 to place the row address on the external address bus 19 (step S21). The signal generating circuit 15 then activates the #RAS signal to have the DRAM 52 recognize the row address (step S22) and sets the flip-flop 16 at time T1 (step S23). Then the signal generating circuit 15 turns the electrical switch 7 in conductive state and writes the row address portion (higher portion) of the address which is placed on the address bus 4 into the page address register 6 (step S24). At last, the signal generating circuit 15 corrects the result of comparison by the first comparator 8, coincidence/uncoincidence, to the state of coincidence (step S25). The operation in the RAS0 state by the signal generating circuit 15 is carried out as described above.

At time T1, the flip-flop 16 has been set in the above-mentioned procedure and indicates that the operation is in the state of paging (YES in step S0). Also because the count value of the second counter 12 remains to be "0" which is smaller than the value of the register 13, and therefore the second comparator 14 does not output the refresh overflow signal REFOF to the signal generating circuit 15 (NO in step S1). Also because the trigger signal Trg1 remains being held in the trigger holding circuit 18 (YES in step S2), and the result of comparison by the first comparator 8, coincidence/uncoincidence, has been corrected to the state of coincidence (YES in step S3) at this time, the procedure of the CAS state is started.

At this time, because the read/write signal is "1" (YES in step S4), the signal generating circuit 15 reads data from the DRAM 52. That is, the signal generating circuit 15 activates the #CAS signal (step S5), turns the reading tri-state buffer 2 in conductive state, and sends the data outputted from the DRAM 52 to the CPU 51 via the external data bus 24 and the data bus 1 (step S6). Then the signal generating circuit 15 turns the reading tri-state buffer 2 to non-conductive state and negates the #CAS signal (step S7). By the above operation completes the access to the DRAM 52 completes, and therefore the trigger which has been held in the trigger holding circuit 18 is cleared (step S8).

While the signal generating circuit 15 executes the operation of the CAS state, the refresh request primary signal is outputted from the first counter 10 and inputted to the second counter 12. Upon receipt of the refresh request primary signal, the value of the second counter 12 changes from "0" to "1". The second counter 12, because the value of itself has become "1" or more, outputs the refresh request signal REFREQ to the signal generating circuit 15.

Also because the number of reservations for the refresh request primary signal held by the second counter 12 is smaller than the value of the register 13 at this time, the second comparator 14 does not output the refresh overflow signal REFOF to the signal generating circuit 15.

At time T3, the flip-flop 16 is set (YES in step S0). Also the second comparator 14 does not output the refresh overflow signal REFOF to the signal generating circuit 15 (NO in step S1), and the trigger signal Trg1 which was held in the trigger holding circuit, 18 has been cleared (NO in step S2), therefore the signal generating circuit 15 does not carry out any processing.

When the CPU 51 outputs a trigger signal Trg2 at time T4, the trigger signal Trg2 is held in the trigger holding circuit 18. At this time, the flip-flop 16 is set and indicated that the operation is in the state of paging (YES in step S0). Also because the value of the second counter 12 is "1" which is smaller than the value of the register 13, the second comparator 14 does not output the refresh overflow signal REFOF to the signal generating circuit 15 (NO in step S1). Also because the trigger signal Trg2 is held in the trigger holding circuit 18 (YES in step S2), and since the result of comparison by the first comparator 8, coincidence/uncoincidence, is the state of coincidence (YES in step S3), the procedure of the CAS state is started.

Because the read/write signal is "0" (NO in step S4), the signal generating circuit 15 carries out writing data into the DRAM 52. That is, the signal generating circuit 15 turns the tri-state buffer 3 in conductive state to have the data outputted by the CPU 51 onto the data bus 1 sent to the DRAM 52 via the external data bus 24 (step S9) while activating the #CAS signal (step S10), then negates the #CAS signal (step S11). At last, the signal generating circuit 15 clears the trigger signal Trg2 held by the trigger holding circuit 18 (step S8).

After time T5, the refresh request primary signal is periodically supplied from the first counter 10 to the second counter 12, and upon receipt of the signal, the value of the second counter increases gradually.

At time T6, because the number of reservations for the refresh request primary signal held by the second counter 12 becomes equal to the value of the register 13, the second comparator 14 outputs the refresh overflow signal REFOF onto the signal line 201 to give it to the signal generating circuit 15. At this time, the flip-flop 16 is set and the value thereof is "1" (YES in step S0), and the DRAM 52 is in the state of paging. Because the second comparator 14 is outputting the refresh overflow signal REFOF onto the signal line 201 and giving it to the signal generating circuit 15 (YES in step S1), the signal generating circuit 15 starts the procedure of the RAS1 state. That is, the signal generating circuit 15 negates the #RAS signal (step S12) and resets the flip-flop 16 (step S13.).

At time T7, the flip-flop 16 is reset and indicates that the DRAM 52 is not in the state of paging (NO in step S0). Because the value of the second counter 12 is "1" or more, the refresh request signal REFREQ is being outputted to the signal generating circuit 15 (YES in step S14). Therefore the signal generating circuit 15 starts the procedure of the REF state. At first the signal generating circuit 15 activates the #CAS signal (step S15) then activates the #RAS signal (step S16). In this state, the DRAM 52 is refreshed. Then the signal generating circuit 15 negates the #CAS signal (step S17), then negates the #RAS signal (step S18). At last, the signal generating circuit 15 sends the refresh ending signal REFEND to the second counter 12 (step S19). Upon receipt of the refresh ending signal REFEND, the second counter 12 decrements the count value of itself by "1".

After time TS, the signal generating circuit 15 repeats the procedure of the REF state until the value of the second counter 12 becomes "0", that is, until there is no refresh request from the second counter 12.

In the first embodiment, because the state of paging of the DRAM 52 will not be canceled by one refresh request, high-speed page mode can be utilized efficiently.

Also in the first embodiment, the first timer circuit 200 is constituted of the second counter 12, the register 13 and the second comparator 14 in such a configuration that enough time interval is given for keeping the state of paging for the purpose of reducing the number of transistors to be used. However, the second timer circuit, 200 may also be made in a similar configuration as the first timer circuit 100 constituted of the frequency divider 90, the first counter 10 and the reload register 11.

Second Embodiment

The second embodiment relates to a DRAM control circuit capable of controlling DRAM of different storage capacity or different bit constitution (×1 bit, ×4 bits, etc.).

Figure 7:
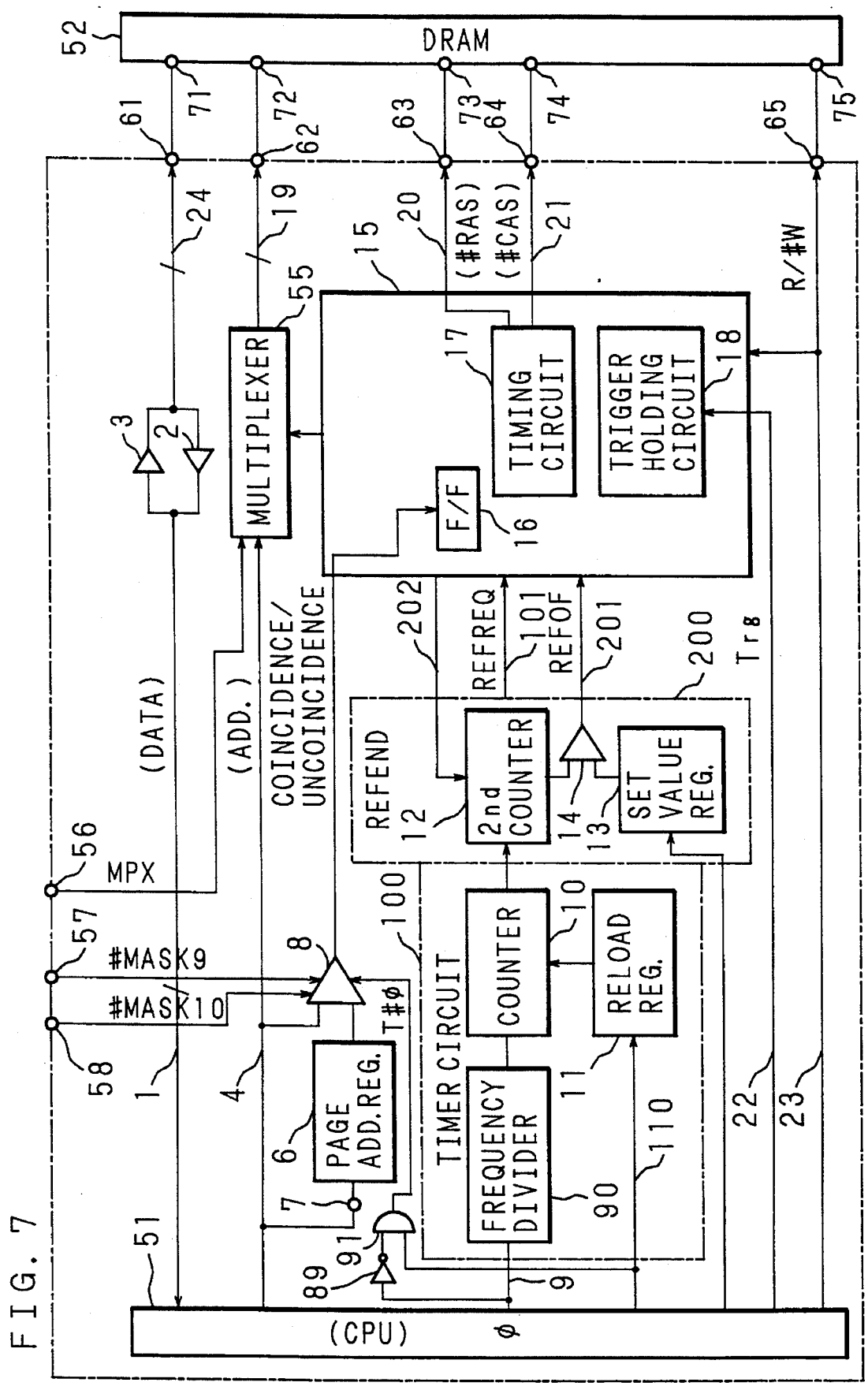
FIG. 7 is a block diagram showing a second embodiment of the configuration of the DRAM control circuit of the invention which is built in a microprocessor.

Overall configuration of the DRAM control circuit of the second embodiment, shown in the block diagram in FIG. 7, is basically same as the configuration of the first embodiment, with only difference in the internal configurations of the multiplexer 5 and the first comparator 8 among the configuration shown in FIG. 3. In the description of the second embodiment that follows, the multiplexer is denoted with numeral 55 and the first comparator is denoted with numeral 88.

In the second embodiment, input terminals 56, 57 and 58 are provided to receive external input, signals MPX, #MASK9 and #MASK10 corresponding to the configuration of the DRAM 52 connected to a microprocessor.

The signal MPX is a signal which is set in advance depending on whether the bit length of the address given to the DRAM 52 is 20 bits or 18 bits, and is given to the multiplexer 55. Specifically, the signal MPX takes a value "1" when the bit length of the address is 20 bits, or a value "0" when the bit length of the address is 18 bit, and is inputted through the terminal 56.

The signals #MASK9 and #MASK10 are signals for preventing the bit 9 and bit 10 of the row address from being subjected to page comparison. These signals are set in advance according to the bit length of the address to be inputted to the DRAM 52 and to the bus width of the data bus 1, and are given to the first comparator 88. The signal #MASK9 is inputted through the terminal 57 and the signal #MASK10 is inputted through the terminal 58.

To the multiplexer 55, a signal RA is given from the signal generating circuit 15. The signal RA takes a value "1" at outputting of the row address, and because it needs to be in synchronization with the #RAS signal, it is generated by a timing generating circuit 17 in the signal generating circuit 15.

To the first comparator 88, a trigger-φ signal T#φ is given. The trigger-φ signal T#φ is a signal obtained by an AND gate 90 as the logical product of the trigger signal (outputted during one cycle of the operation clock φ) which is outputted from the CPU 51 and a signal #φ which is the inverted operation clock φ obtained by an inverter 89.

Figure 8:
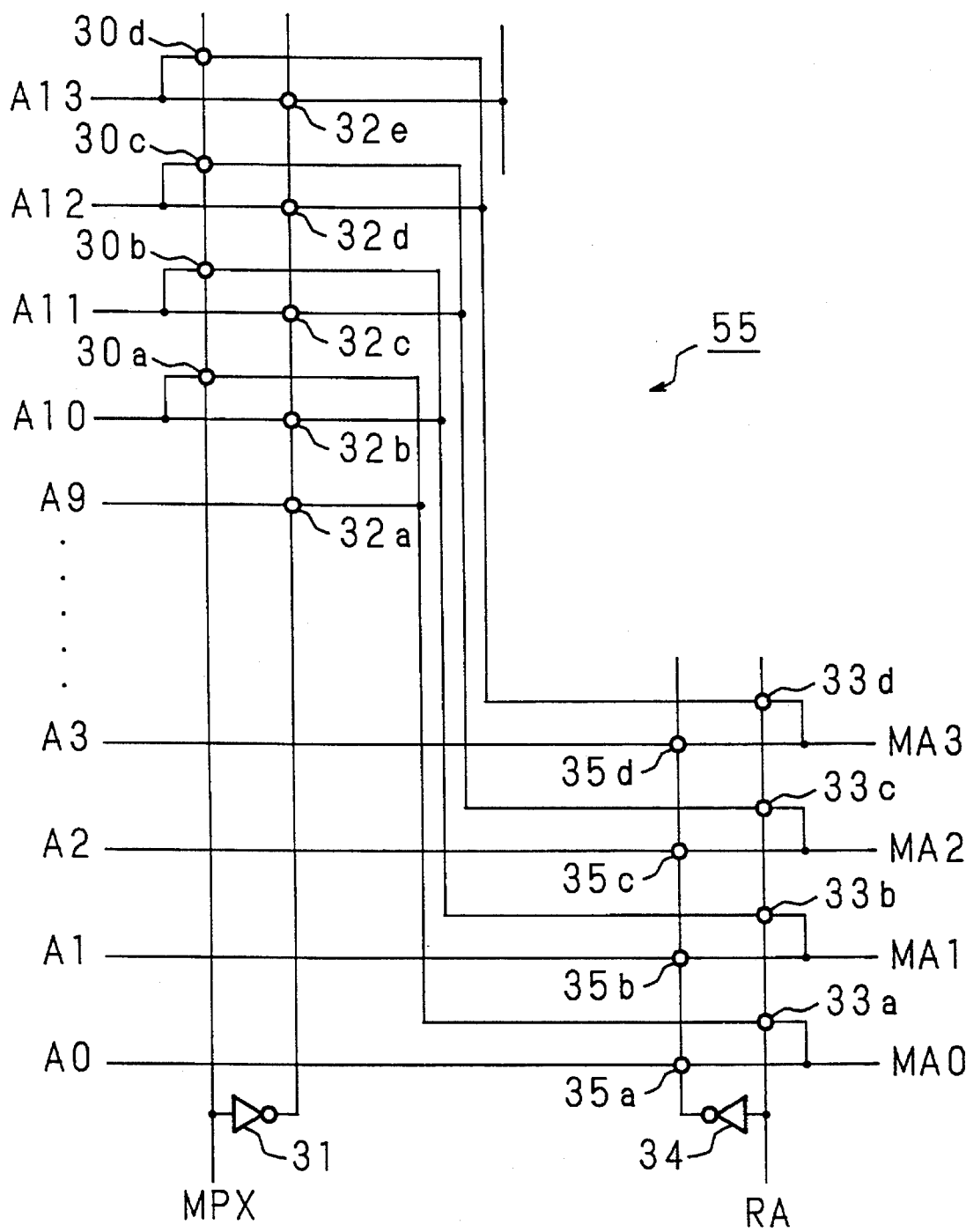
FIG. 8 is a circuit diagram showing a configuration of a multiplexer in the second embodiment of the DRAM control circuit of the invention.

FIG. 8 is a circuit diagram showing the configuration of the multiplexer 55 in the second embodiment. In the second embodiment, the MPX and the signal RA are given to the multiplexer 55 as described above.

In FIG. 8, numerals 30a through 30d denote electrical switches which conduct when the signal MPX outputted from the CPU 51 is "1", 31 denotes an inverter which inputs the signal MPX and outputs its inverted signal and 32a through 32e denote electric switches which conduct when the output of the inverter 31 is "1", that is, when the signal MPX is Numerals 33a through 33d denote electrical switches which conduct when the signal RA is "1", 34 denotes an inverter which inputs the signal RA and outputs its inverted signal, and 35a through 35d denote electrical switches which conduct when the output of the inverter 34 is "1", that is, when the signal RA is "0".

Figure 9:
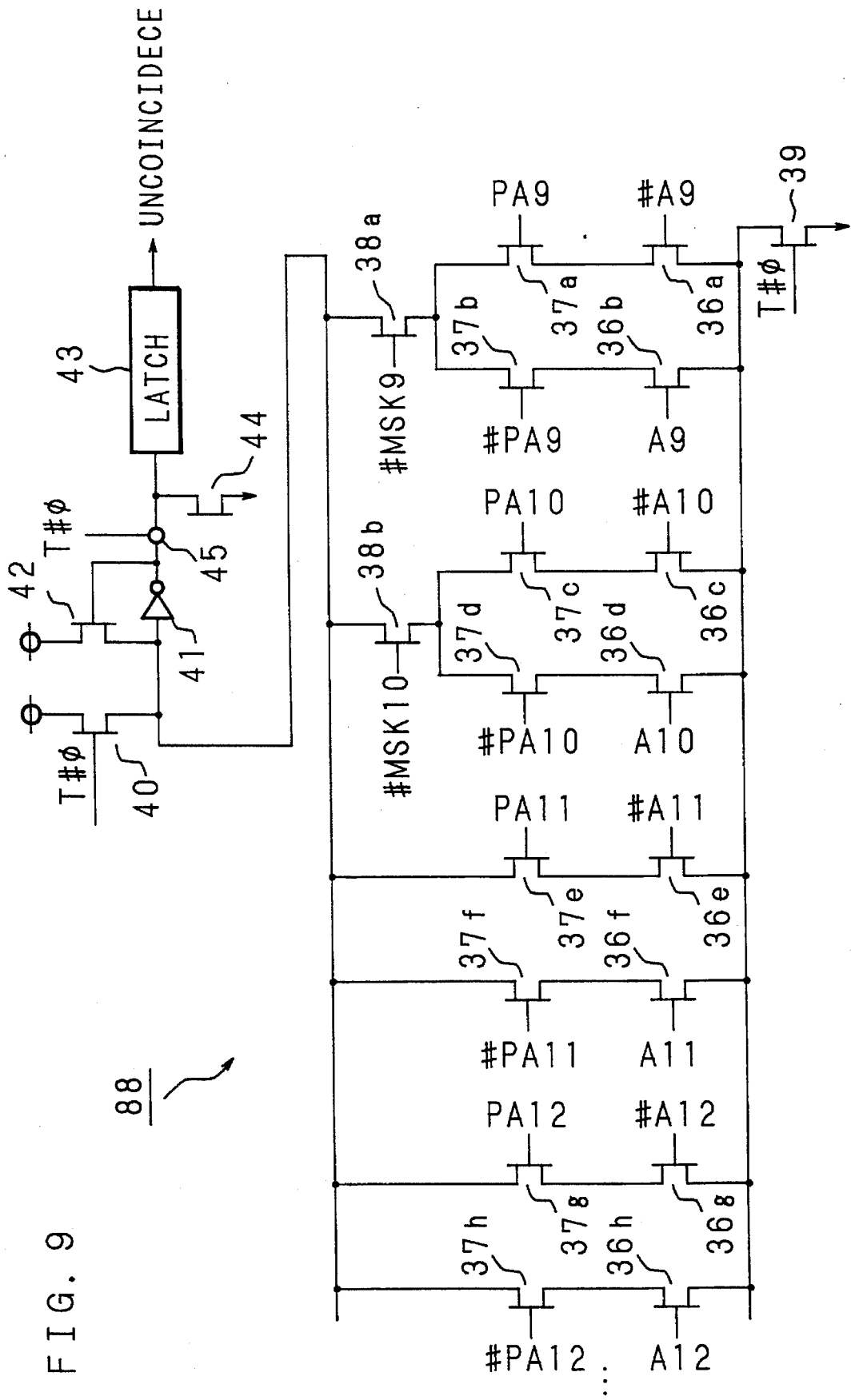
FIG. 9 is a circuit diagram showing a configuration of a first comparator in the second embodiment of the DRAM control circuit of the invention.

FIG. 9 is a circuit diagram showing the configuration of the first comparator 88 of the second embodiment of the DRAM control circuit. In the second embodiment, the first comparator 88 is given the trigger-φ signal T#φ, the signal #MASK9 and the signal #MASK10, as described above.

In FIG. 9, numerals 36a through 36h denote N-channel transistors which conduct when address signals A9, A10 . . . on the address bus 1 and inverted signals thereof #A9, #A10 . . . are "1". Numerals 37a through 37h denote N-channel transistors which conduct when values PA9, PA10 . . . of the page address register 6 and inverted signals thereof #PA9, #PA10 . . . are "1".

Numerals 38a and 38b denote N-channel transistors which conduct when the signal #MASK9 and the signal #MASK10 are "1", 39 denote an N-channel transistor which conducts when the trigger-φ signal T#φ is "1", and 40 denotes a P-channel transistor which conducts when the trigger-φ signal T#φ is "0". Numeral 41 denotes an inverter, 42 denotes a P-channel transistor which conducts when the output from the inverter 41 is "0", 45 denotes an electric switch which conducts when the trigger-φ signal T#φ is "1", 43 denotes a latch and 44 denotes an N-channel transistor for forcibly clearing the value of the latch 43.

The trigger-φ signal T#φ is a signal obtained by the AND gate 90 as the logical product of the trigger signal (outputted during one cycle of the operation clock φ) which is outputted from the CPU 51 and the signal #φ which is the inverted operation clock φ obtained from the inverter 89, as described above. The address signal and the trigger signal are outputted from the CPU 51 at the same time. On the other hand, the value of the page address register 6 and the inverted signal thereof are always inputted to the N-channel transistors 37a, 37b . . . as the signals PA9, PA10 . . . and inverted signals thereof #PA9, #PA10 . . . . Because the address signal is outputted from a period wherein the operation clock φ is "1", it becomes a stable state before the time when operation clock φ becomes "0". The N-channel transistor 39 conducts in the period wherein the address signal is stable, that is, the trigger-φ signal T#φ is "1".

In a period wherein the trigger-φ signal T#φ is "0", input signal line of the inverter 41 is precharged to "1" by the P-channel transistor 40. Therefore, when the signal #MASK9 and the signal #MASK10 are both "1" and when the N-channel transistors 38a and 38b are conducting, charged state of the input signal line of the inverter 41 is kept to remain "1", provided that the address signals A9, A10 . . . on the address bus 1 and the values PA9, PA10 . . . of the page address register 6 are in complete coincidence with each other.

When even one bit is different between the address signals A9, A10 . . . on the address bus 1 and values PA9, PA10 . . . of the page address register 6, the input signal line of the inverter 41 is discharged to become "0".

When the signal #MASK9 is "0" and the N-channel transistor 38a is non-conducting, disagreement of the address signal A9 and the value PA9 of the page address register 6 does not affect discharging of the input signal line of the inverter 41. When the signal #MASK10 is "0" and the N-channel transistor 38 is non-conducting, disagreement of the address signal A10 and the value PA10 of the page address register 6 does not affect discharging of the input signal line of the inverter 41.

Now the operation of the second embodiment will be described below. A case in which a DRAM of 1M×4 bits is connected to an 8-bit data bus and a DRAM of 1M×1 bit is connected to an 8-bit data bus will be taken as examples.

The DRAM 52 of 1M×4 bits corresponds to 18-bit address, when it is used in high-speed page mode, it is required that A17 through A9 as the row addresses and A8 through A0 as the column addresses are given. While the column address and the row address are multiplexed and outputted through the external address bus 19, the addresses A9 and A0 are outputted by using the same signal line (the same is applied to A1 and those that follow). This operation is carried out as follows.

Value "0" as a set value of the signal MPX is inputted to the multiplexer 55. Thereafter, when value "1" as a period signal RA four outputting the row address is inputted, the row addresses A9 . . . are outputted instead of the column addresses A0 . . . which have been outputted.

Because the row addresses are A9 . . . in this case, it is necessary to carry out the comparison between the address signal on the address bus 1 and the value of the page address register 6 in the first comparator 88 on the more higher bits than A9. For this reason, value "1" is given to the first comparator 88 as the signal #MASK9 and the signal #MASK10. This causes the comparison between the address signal on the address bus 1 and the value of the page address register 6 to be carried out on the more higher bits than A9.

Now a case of connecting a DRAM 52 of 1M×1 bit to an 8-bit data bus will be described below, The DRAM 52 of 1M×1 bit corresponds to 20-bit address, and when it is used in high-speed page mode, it is required that A19 through A10 as the row addresses and A9 through A0 as the column addresses are given. While the column address and the row address are multiplexed and outputted through the external address bus 19, the addresses A10 and A0 are outputted by using the same signal line (the same is applied to A1 and those that follow). This operation is carried out as follows.

Value "1" as a set value of the signal MPX is inputted through the terminal 56 and given to the multiplexer 55. Thereafter, when value "1" for the period signal RA for outputting the row address is inputted from the signal generating circuit 15, the row addresses A10 . . . are outputted instead of the column addresses A0 . . . which have been outputted.

Because the row addresses are A10, . . . in this case, it is necessary to carry out the comparison between the address signal on the address bus 1 and the value of the page address register 6 in the first comparator 88 on A10 and more higher bits. For this reason, value "0" as the signal #MASK9 and value "1" as the signal #MASK10 are given to the first comparator 88 respectively. This makes the result of comparison independent of whether the address A9 and the value PA9 of the page address register 6 coincide with each other or not, and causes the comparison between the address signal on the address bus 1 and the value of the page address register 6 to be carried out on the address A10 and more significant bits.

It is also possible to apply the DRAM control circuit of the second embodiment to a plurality of bus widths. As an example of such an application, a case of connecting a DRAM 52 of 1M×4 bits to a 16-bit bus will be described below. In this case, it is required to provide A18 through A10 as the row addresses and A9 through A1 as the column addresses. However, because these are the row addresses and the column addresses being shifted by 1 bit by the 8-bit bus, it can be achieved simply by shifting the connection of the DRAM 52 and the external address bus 19 by 1 bit upward.

In this case, because the row addresses are A10, . . . , it is necessary to carry out the comparison between the address signal on the address bus 1 and the value of the page address register 6 in the first comparator 88 on A10 and more higher bits. For this reason, value "0" as the signal #MASK9 and value "1" as the signal #MASK10 are given to the first comparator 88 from the terminal 57. This makes the result of comparison independent of whether the address A9 and the value PA9 of the page address register 6 coincide with each other or not, and causes the comparison between the address signal on the address bus 1 and the value of the page address register 6 to be carried out on A10 and more significant bits.

Although types of DRAMs of different storage capacities or different bit constitutions which can be provided for by the second embodiment are limited, it is made possible to accommodate to more types of DRAMs by a slight modification of the second embodiment.

According to the DRAM control circuit of the invention described in detail above, because it is made possible to change the period of time during which the so-called high-speed page mode is kept by changing the set value of the set value register according to the specification of the DRAM, high-speed page mode of the DRAM being connected can be efficiently utilized thereby increasing the access speed.

Also according to the DRAM control circuit of the invention, DRAMs of different storage capacities or different bit constitutions can be provided for by simple setting of the specified signal.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalents of such meets and bounds thereof are therefore intended to be embraced by the claims.

What is claimed is:

1. A control circuit for a DRAM, comprising:
   a multiplexer which divides a time division multiplexed address signal outputted from a CPU into a row address signal and a column address signal;
   timing means for generating a refresh request signal at a constant time interval;
   a first register which holds the row address signal among the address signal outputted from said CPU;
   first comparing means for comparing the row address signal among the address signal outputted from said CPU with the row address held by said first register;
   signal generating means, which has storing means for storing the comparing result, coincidence/uncoincidence, by said first comparing means, and,
      when said storing means stores the comparing result of disagreement by the first comparing means, for accessing to said DRAM by controlling said multiplexer according to the access request signal outputted from said CPU to output a row address signal and a valid row address strobe signal so that said DRAM recognizes the row address, and to output a column address signal and a valid column address strobe signal so that said DRAM recognizes the column address;
      when said storing means stores the comparing result of coincidence by said first comparing means, for successively accessing to said DRAM by controlling said multiplexer according to the access request signal outputted from said CPU to supply column address signals and valid column address strobe signals successively to said DRAM so that said DRAM recognizes the column addresses; and
      when a refresh request signal is given from said timing means, for refreshing said DRAM by a predetermined procedure;
   further comprising:
      a counter which counts the number of times of generation of the refresh request signal generated by said timing means;
      a second register which holds the maximum number of reservations for refreshing said DRAM; and
      second comparing means for comparing the count value of said counter and a value held by said second register;
      wherein, when said storing means stores the comparing result of coincidence by said first comparing means, said signal generating means refreshes said DRAM by the predetermined procedure only at a time when said second comparing means detects coincidence between the count value of said counter and the value held by said second register.

2. A control circuit for a DRAM, comprising:

a multiplexer which divides a time division multiplexed address signal outputted from a CPU into a row address signal and a column address signal, according to a signal supplied in accordance to the configuration of a DRAM;

timing means for generating a refresh request signal at a constant time interval;

a first register which holds the row address signal among the address signal outputted from said CPU;

first comparing means for comparing only the row address signal among the address signal outputted from said CPU with a row address held by said first register, according to the signal supplied in accordance to the configuration of said DRAM;

signal generating means, which has storing means for storing the comparing result, coincidence/uncoincidence, by said first comparing means, and, when said storing means stores the comparing result of disagreement by said first comparing means, for accessing to said DRAM by controlling said multiplexer according to the access request signal outputted from said CPU to output a row address signal and a valid row address strobe signal so that said DRAM recognizes the row address, and to output a column address signal and a valid column address strobe signal so that said DRAM recognizes the column address;

when said storing means stores the comparing result of coincidence by said first comparing means, for successively accessing to said DRAM by controlling said multiplexer according to the access request signal outputted from said CPU to supply column address signals and valid column address strobe signals successively to said DRAM so that said DRAM recognizes the column addresses; and when a refresh request signal is given from said timing means, for refreshing said DRAM by a predetermined procedure;

further comprising:

a counter which counts the number of times of generation of the refresh request signal generated by said timing means;

a second register which holds the maximum number of reservations for refreshing said DRAM; and second comparing means for comparing the count value of the counter and a value held by said second register;

wherein, when said storing means stores the comparing result of coincidence by said first comparing means, said signal generating means refreshes said DRAM by the predetermined procedure only at a time when said second comparing means detects coincidence between the count value of said counter and the value held by said second register.

* * * * *